(12) United States Patent
He

(10) Patent No.: US 11,112,664 B2
(45) Date of Patent: Sep. 7, 2021

(54) ACTIVE MATRIX SUBSTRATE AND DISPLAY APPARATUS

(71) Applicant: HKC Corporation Limited, Shenzhen (CN)

(72) Inventor: Huailiang He, Shenzhen (CN)

(73) Assignee: HKC Corporation Limited, Shenzhen (CN)

( * ) Notice: Subject to any disclaimer, the term of this patent is extended or adjusted under 35 U.S.C. 154(b) by 0 days.

(21) Appl. No.: 16/641,086

(22) PCT Filed: Nov. 15, 2017

(86) PCT No.: PCT/CN2017/111114
§ 371 (c)(1),
(2) Date: Feb. 21, 2020

(87) PCT Pub. No.: WO2019/037289
PCT Pub. Date: Feb. 28, 2019

(65) Prior Publication Data
US 2020/0183237 A1  Jun. 11, 2020

(30) Foreign Application Priority Data
Aug. 25, 2017  (CN) .......................... 201710741947.1

(51) Int. Cl.
   *G02F 1/1362*  (2006.01)
   *G02F 1/1368*  (2006.01)
   *H01L 27/12*   (2006.01)

(52) U.S. Cl.
   CPC ...... *G02F 1/136259* (2013.01); *G02F 1/1368* (2013.01); *G02F 1/136213* (2013.01); *G02F 1/136286* (2013.01); *H01L 27/124* (2013.01); *H01L 27/1255* (2013.01); *G02F 1/136263* (2021.01)

(58) Field of Classification Search
   CPC ......... G02F 1/136213; G02F 1/136286; G02F 1/136259; G02F 1/1309; G02F 2001/136263; G02F 2001/136272; G02F 2201/506; G09G 2330/08
   See application file for complete search history.

(56) References Cited

U.S. PATENT DOCUMENTS

| 2006/0071212 A1* | 4/2006 | Song | H01L 27/1255 257/59 |
| 2009/0251615 A1* | 10/2009 | Tsubata | G02F 1/134336 348/725 |
| 2013/0092946 A1* | 4/2013 | Ma | G02F 1/136259 257/59 |

* cited by examiner

*Primary Examiner* — Mariam Qureshi
(74) *Attorney, Agent, or Firm* — Wang Law Firm, Inc.

(57) ABSTRACT

The present disclosure illustrates an active matrix substrate includes pixel electrodes forming the pixels; first gate lines respectively disposed between the pixel electrodes; first source line respectively disposed between the pixel electrodes and extended in a direction crossing the first gate lines; first capacitor lines respectively disposed between the first gate lines and extended in nonparallel to one another; switch devices respectively disposed on the pixel electrodes; second source lines respectively disposed between the pixel electrodes and extended in parallel to the first source lines; second gate lines respectively disposed between the pixel electrode and extended in parallel to the first gate lines; and second capacitor lines respectively adjacent to the first capacitor lines and extended in nonparallel to the first capacitor lines. The first gate lines, first capacitor lines, first source lines, second gate lines, second capacitor lines and second source lines are isolated from each other.

18 Claims, 9 Drawing Sheets

ACTIVE MATRIX SUBSTRATE AND DISPLAY APPARATUS

CROSS-REFERENCE TO RELATED APPLICATION

This application is a National Stage Application of PCT International Patent Application No. PCT/CN2017/111114 filed on Nov. 15, 2017, under 35 U.S.C. § 371, which claims priority to and the benefit of Chinese Patent Application No. 201710741947.1, filed on Aug. 25, 2017, and the disclosure of which is incorporated herein in its entirety by reference.

BACKGROUND

1. Field

The present disclosure relates to a liquid crystal display technology field, and more particularly to an active matrix substrate having a defect repair function.

2. Description of the Related Art

A flat-panel display can use two sets of address lines which are perpendicular to each other, to control pixels arranged in a matrix form, so as to display an image. Among various display control modes, the most common mode is to control a gate line and a source line to turn on or turn off the corresponding switch device, so that signals transmitted on the gate lines can be written into the pixels, respectively, thereby changing states of the pixels and controlling the display screen.

In recent years, the flat-panel display technology is fully developed, but the elements of the display panel, such as an active matrix substrate, may have some defects caused in the manufacturing process. For example, the gate line and the source line on the active matrix substrate both have very long lengths, so a broken line may occur easily on the gate line and the source line. When at least one of the gate lines or the source lines is broken, a normal voltage (a drain voltage) cannot be applied to pixel electrodes on the disconnected gate line. As a result, dot defects are visually recognized as a line defect along the disconnected gate line on the display screen of the liquid crystal display device, and a liquid crystal display device becomes defective as the number of such line defects increases. As a result, manufacturing yield of the liquid crystal display device is reduced.

SUMMARY

In order to solve aforementioned problems, the present disclosure provides a liquid crystal display device having broken-line repair function, so as to improve the manufacturing yield of the liquid crystal display device.

According to an embodiment, the present disclosure provides an active matrix substrate including: a substrate; a plurality of pixel electrodes disposed on the substrate and arranged in a matrix form, so as to form a plurality of pixels; a plurality of first gate lines disposed between the plurality of pixel electrodes respectively, and extended in parallel to each other; a plurality of first source lines disposed between the plurality of pixel electrodes respectively, and extended in a direction crossing the plurality of first gate lines; a plurality of first capacitor lines disposed between the plurality of first gate lines respectively, and extended at an angle to one another; a plurality of switch devices disposed on the plurality of pixel electrodes respectively, and electrically connected to the plurality of pixel electrodes, the plurality of first gate lines, the plurality of first capacitor lines and the plurality of first source lines, respectively; a plurality of second source lines disposed between the plurality of pixel electrodes respectively, and extended in parallel to the plurality of first source lines; a plurality of second gate line disposed between the plurality of pixel electrodes respectively, and extended in parallel to the plurality of first gate lines; and a plurality of second capacitor lines disposed adjacent to the plurality of first capacitor lines respectively, and extended at an angle to one another. The plurality of first gate lines, the plurality of first capacitor lines, the plurality of first source lines, the plurality of second gate lines, the plurality of second capacitor lines and the plurality of second source lines are isolated from each other.

Preferably, when one of the plurality of the first gate lines is broken, an end and the other end of the broken first gate line are conducted through the second gate line adjacent to the broken first gate line, and a pair of source line repair sections formed by parts of the two second source lines at two sides of the broken first gate line.

Preferably, when one of the first gate lines is broken and one of the second gate lines adjacent to the broken first gate line is also broken and broken locations are between the same two pixel electrodes, an end and the other end of the broken first gate line are conducted through a pair of source line repair sections formed by parts of the second source lines, and a capacitor line repair section formed by a part of the second capacitor line.

Preferably, when one of the first source lines is broken, an end and the other end of the broken first source line are conducted through the second source line adjacent to the first source line, and a pair of gate line repair sections formed by parts of the second gate lines at two sides of the broken first source line.

Preferably, when one of the first source lines is broken, and one of the second source lines adjacent to the broken first source line is also broken and broken locations are between the two the same pixel electrodes, an end and the other end of the broken first source line is conducted through a pair of gate line repair sections formed by a part of the second gate lines and a source line repair section formed by a part of the other second source line.

Preferably, when one of the first capacitor lines is broken, an end and the other end of the broken first capacitor line are conducted through a pair of source line repair sections formed by parts of the second source lines corresponding in position to two sides of the broken first capacitor line, and the second capacitor line adjacent to the broken first capacitor line.

Preferably, when one of the first capacitor lines is broken, and one of the second capacitor lines adjacent to the broken first capacitor line is also broken and broken locations are between the same two pixel electrodes, an end and the other ends of the first capacitor line are conducted through a pair of source line repair sections formed by parts of the two second source lines, and a gate line repair section formed by a part of the second gate line.

According to an embodiment, the present disclosure provides a repair method for an active matrix substrate. The active matrix substrate includes a substrate; a plurality of pixel electrodes disposed on the substrate and arranged in a matrix form, so as to form a plurality of pixels; a plurality of first gate lines disposed between the plurality of pixel electrodes respectively, and extended in parallel to each other; a plurality of first source lines disposed between the plurality of pixel electrodes respectively, and extended in a direction crossing the plurality of first gate lines; a plurality of first capacitor lines disposed between the plurality of first gate lines respectively, and extended at an angle to one another; a plurality of switch devices disposed on the plurality of pixel electrodes respectively, and electrically connected to the plurality of pixel electrodes, the plurality of first gate lines, the plurality of first capacitor lines and the plurality of first source lines, respectively; a plurality of second source lines disposed between the plurality of pixel electrodes respectively, and extended in parallel to the plurality of first source lines; a plurality of second gate line disposed between the plurality of pixel electrodes respectively, and extended in parallel to the plurality of first gate lines; and a plurality of second capacitor lines disposed adjacent to the plurality of first capacitor lines respectively, and extended at an angle to one another. The plurality of first gate lines, the plurality of first capacitor lines, the plurality of first source lines, the plurality of second gate lines, the plurality of second capacitor lines and the plurality of second source lines are isolated from each other. The repair method includes following steps: performing the broken-line inspection process to inspect whether the broken line exists on one of the first gate lines and the second gate lines; if only one of the first gate lines is inspected to be broken, performing a source line repair-section forming process to cut off the cut portions of the second source lines disposed at two sides of the pixel electrode corresponding to a broken location of the first gate line, so as to form source line repair sections overlapping with the broken first gate line and the second gate line, wherein a part of the cut portions locate near the same side of the broken first gate line opposite to the second gate line, and the other part of the cut portions locate near the same side of the second gate line opposite to the broken first gate line; performing a gate line repair-section forming process on the second gate line, adjacent to the broken first gate line, to cut off the cut portions of the second gate line respectively located at two sides of the second source lines disposed at two sides of the broken location, so as to form a gate line repair section overlapping with the second source lines; and performing a connection process to electrically connect portions of the source line repair sections, overlapping with the broken first gate line, to the broken first gate line respectively, and electrically connect portions of the source line repair sections, overlapping with the second gate line, to the gate line repair section.

According to an embodiment, the present disclosure provides a repair method for an active matrix substrate. The active matrix substrate includes a substrate; a plurality of pixel electrodes disposed on the substrate and arranged in a matrix form, so as to form a plurality of pixels; a plurality of first gate lines disposed between the plurality of pixel electrodes respectively, and extended in parallel to each other; a plurality of first source lines disposed between the plurality of pixel electrodes respectively, and extended in a direction crossing the plurality of first gate lines; a plurality of first capacitor lines disposed between the plurality of first gate lines respectively, and extended at an angle to one another; a plurality of switch devices disposed on the plurality of pixel electrodes respectively, and electrically connected to the plurality of pixel electrodes, the plurality of first gate lines, the plurality of first capacitor lines and the plurality of first source lines, respectively; a plurality of second source lines disposed between the plurality of pixel electrodes respectively, and extended in parallel to the plurality of first source lines; a plurality of second gate line disposed between the plurality of pixel electrodes respectively, and extended in parallel to the plurality of first gate lines; and a plurality of second capacitor lines disposed adjacent to the plurality of first capacitor lines respectively, and extended at an angle to one another. The plurality of first gate lines, the plurality of first capacitor lines, the plurality of first source lines, the plurality of second gate lines, the plurality of second capacitor lines and the plurality of second source lines are isolated from each other. The repair method includes following steps: preforming the broken-line inspection process to inspect whether the broken line exists on one of the first gate lines and the second gate lines; if one of the first gate lines and one of the second gate line both are inspected to be broken, performing a source line repair-section forming process to cut off the cut portions of the second source lines disposed at two sides of the pixel electrode corresponding to broken locations of the first gate line and the second gate line, so as to form source line repair sections overlapping with the broken first gate line and the second capacitor line, wherein a part of the cut portions locate near the same side of the broken first gate line opposite to the second capacitor line, and the other part of the cut portions locate near the same side of the second capacitor line opposite to the broken first gate line; performing a capacitor line repair-section forming process on the second capacitor line to cut off the cut portions of second capacitor line respectively located at two sides of the second source lines disposed at two sides of the pixel electrode corresponding to the broken location, so as to form a capacitor line repair section overlapping with the second source lines; and performing a connection process to electrically connect portions of the source line repair sections, overlapping with the broken first gate line, to the broken first gate line respectively, and connect portions of the source line repair sections, overlapping with the second capacitor line, to the capacitor line repair section.

According to an embodiment, the present disclosure further provides a repair method for an active matrix substrate. The active matrix substrate includes a substrate; a plurality of pixel electrodes disposed on the substrate and arranged in a matrix form, so as to form a plurality of pixels; a plurality of first gate lines disposed between the plurality of pixel electrodes respectively, and extended in parallel to each other; a plurality of first source lines disposed between the plurality of pixel electrodes respectively, and extended in a direction crossing the plurality of first gate lines; a plurality of first capacitor lines disposed between the plurality of first gate lines respectively, and extended at an angle to one another; a plurality of switch devices disposed on the plurality of pixel electrodes respectively, and electrically connected to the plurality of pixel electrodes, the plurality of first gate lines, the plurality of first capacitor lines and the plurality of first source lines, respectively; a plurality of second source lines disposed between the plurality of pixel electrodes respectively, and extended in parallel to the plurality of first source lines; a plurality of second gate line disposed between the plurality of pixel electrodes respectively, and extended in parallel to the plurality of first gate lines; and a plurality of second capacitor lines disposed adjacent to the plurality of first capacitor lines respectively, and extended at an angle to one another. The plurality of first gate lines, the plurality of first capacitor lines, the plurality of first source lines, the plurality of second gate lines, the plurality of second capacitor lines and the plurality of second source lines are isolated from each other. The repair method includes following steps: preforming the broken-line inspection process to inspect whether the broken line exists on one of the first source lines and the second source lines; if only one of the first source lines is inspected to be broken, performing a gate line repair-section forming process to cut off the cut portions of the second gate lines disposed at two sides of the pixel electrode corresponding to a broken location of the first source line, so as to form gate line repair sections overlapping with the broken first source line and the second source line, wherein a part of the cut portions locate near the same side of the broken first source line opposite to the first source line, and the other part of the cut portions locate near the same side of the second source line opposite to the broken first source line; performing a source line repair-section forming process on the second source line, adjacent to the broken first source line, to cut off the cut portions of the second source line respectively located at two sides of the second gate lines disposed at two sides of the pixel electrode corresponding to the broken location, so as to form a source line repair section overlapping with the second gate lines; and performing a connection process to electrically connect the gate line repair sections to the broken first source line respectively, and electrically connect portions of the source line repair sections, overlapping with the second gate line, to the gate line repair section.

According to an embodiment, the present disclosure further provides a repair method for an active matrix substrate. The active matrix substrate includes a substrate; a plurality of pixel electrodes disposed on the substrate and arranged in a matrix form, so as to form a plurality of pixels; a plurality of first gate lines disposed between the plurality of pixel electrodes respectively, and extended in parallel to each other; a plurality of first source lines disposed between the plurality of pixel electrodes respectively, and extended in a direction crossing the plurality of first gate lines; a plurality of first capacitor lines disposed between the plurality of first gate lines respectively, and extended at an angle to one another; a plurality of switch devices disposed on the plurality of pixel electrodes respectively, and electrically connected to the plurality of pixel electrodes, the plurality of first gate lines, the plurality of first capacitor lines and the plurality of first source lines, respectively; a plurality of second source lines disposed between the plurality of pixel electrodes respectively, and extended in parallel to the plurality of first source lines; a plurality of second gate line disposed between the plurality of pixel electrodes respectively, and extended in parallel to the plurality of first gate lines; and a plurality of second capacitor lines disposed adjacent to the plurality of first capacitor lines respectively, and extended at an angle to one another. The plurality of first gate lines, the plurality of first capacitor lines, the plurality of first source lines, the plurality of second gate lines, the plurality of second capacitor lines and the plurality of second source lines are isolated from each other. The repair method includes following steps: performing the broken-line inspection process to inspect whether the broken line exists on one of the first source lines and the second source lines; if one of the first source lines and one of the second source lines both are inspected to be broken, and broken locations are between the same two pixel electrodes, performing a gate line repair-section forming process to cut off the cut portions of the second gate lines disposed at two sides of the pixel electrode corresponding to the broken locations of the first source line and the second source line, so as to form gate line repair sections overlapping with the broken first source line and the other second source line, wherein a part of the cut portions locate near the same side of the broken first source line opposite to the other second source line, and the other part of the cut portions locate near the same side of the other second source line opposite to the broken first source line; performing a source line repair-section forming process on the other second source line to cut off the cut portions of the other second source line respectively located at two sides of the second gate lines disposed at two sides of the pixel electrode corresponding to the broken location, so as to form a source line repair section overlapping with the second gate lines; and performing a connection process to electrically connect the gate line repair sections to the broken first source line respectively, and electrically connect portions of the gate line repair sections, overlapping with the second source line, to the source line repair section.

According to an embodiment, the present disclosure further provides a repair method for an active matrix substrate. The active matrix substrate includes a substrate; a plurality of pixel electrodes disposed on the substrate and arranged in a matrix form, so as to form a plurality of pixels; a plurality of first gate lines disposed between the plurality of pixel electrodes respectively, and extended in parallel to each other; a plurality of first source lines disposed between the plurality of pixel electrodes respectively, and extended in a direction crossing the plurality of first gate lines; a plurality of first capacitor lines disposed between the plurality of first gate lines respectively, and extended at an angle to one another; a plurality of switch devices disposed on the plurality of pixel electrodes respectively, and electrically connected to the plurality of pixel electrodes, the plurality of first gate lines, the plurality of first capacitor lines and the plurality of first source lines, respectively; a plurality of second source lines disposed between the plurality of pixel electrodes respectively, and extended in parallel to the plurality of first source lines; a plurality of second gate line disposed between the plurality of pixel electrodes respectively, and extended in parallel to the plurality of first gate lines; and a plurality of second capacitor lines disposed adjacent to the plurality of first capacitor lines respectively, and extended at an angle to one another. The plurality of first gate lines, the plurality of first capacitor lines, the plurality of first source lines, the plurality of second gate lines, the plurality of second capacitor lines and the plurality of second source lines are isolated from each other. The repair method includes following steps: performing the broken-line inspection process to inspect whether the broken line exists on one of the first capacitor lines and the second capacitor lines; if only one of the first capacitor lines is inspected to be broken, performing a source line repair-section forming process to cut off the cut portions of the second source lines disposed at two sides of the pixel electrode corresponding to a broken location of the first capacitor line, so as to form source line repair sections overlapping with the broken first capacitor line and the second capacitor line, wherein a part of the cut portions locate near the same side of the broken first capacitor line opposite to the second capacitor line, and the other part of the cut portions locate near the same side of the second capacitor line opposite to the broken first capacitor line; performing a source line repair-section forming process on the second source line, adjacent to the broken first capacitor line, to cut off the cut portions of the second source line respectively located at two sides of the second source lines disposed at two sides of the pixel electrode corresponding to the broken location, so as to form a capacitor line repair section overlapping with the second source lines; and performing a connection process to electrically connect portions of the source line repair sections, overlapping with the broken first capacitor line, to the broken first capacitor line respectively, and electrically connect portions of the capacitor line repair sections, overlapping with the second source line, to the source line repair section.

According to an embodiment, the present disclosure further provides a repair method for an active matrix substrate. The active matrix substrate includes a substrate; a plurality of pixel electrodes disposed on the substrate and arranged in a matrix form, so as to form a plurality of pixels; a plurality of first gate lines disposed between the plurality of pixel electrodes respectively, and extended in parallel to each other; a plurality of first source lines disposed between the plurality of pixel electrodes respectively, and extended in a direction crossing the plurality of first gate lines; a plurality of first capacitor lines disposed between the plurality of first gate lines respectively, and extended at an angle to one another; a plurality of switch devices disposed on the plurality of pixel electrodes respectively, and electrically connected to the plurality of pixel electrodes, the plurality of first gate lines, the plurality of first capacitor lines and the plurality of first source lines, respectively; a plurality of second source lines disposed between the plurality of pixel electrodes respectively, and extended in parallel to the plurality of first source lines; a plurality of second gate line disposed between the plurality of pixel electrodes respectively, and extended in parallel to the plurality of first gate lines; and a plurality of second capacitor lines disposed adjacent to the plurality of first capacitor lines respectively, and extended at an angle to one another. The plurality of first gate lines, the plurality of first capacitor lines, the plurality of first source lines, the plurality of second gate lines, the plurality of second capacitor lines and the plurality of second source lines are isolated from each other. The repair method includes following steps: performing the broken-line inspection process to inspect whether the broken line exists on one of the first capacitor lines and the second capacitor lines; if one of the first capacitor lines and one of the second capacitor lines both are inspected to be broken, and broken locations are between the same two pixel electrode, performing a source line repair-section forming process to cut off the cut portions of the second source lines disposed at two sides of the pixel electrode corresponding to the broken location of the broken first capacitor line and the broken second capacitor line, so as to form source line repair sections overlapping with the broken first capacitor line and the second gate line, wherein a part of the cut portions locate near the same side of the broken first capacitor line opposite to the second gate line, and the other part of the cut portions locate near the same side of the second gate line opposite to the broken first capacitor line; performing a gate line repair-section forming process on the second gate line to cut off the cut portions of the second gate line respectively located at two sides of the second source lines disposed at two sides of the pixel electrode corresponding to the broken location, so as to form a gate line repair section overlapping with the second source lines; and performing a connection process to electrically connect portions of the source line repair sections, overlapping with the broken first capacitor line, to the broken first capacitor line respectively, and electrically connect portions of the gate line repair sections, overlapping with the second source line, to the source line repair section.

Preferably, the operations of cutting off and connection are performed by laser radiation.

Preferably, the connection areas are coated with nano metal solution. The nano metal solution may include organic solvent and nano metal particles uniformly distributed in the organic solvent. The nano metal solution is radiated by laser to be hardened for conduction.

According to aforementioned content, the present disclosure provides an active matrix substrate which is able to repair the broken line, so that the manufacturing yield of the liquid crystal display device can be improved. Furthermore, during the repair process, the connection portions of the repair sections are coated with nano metal solution, and the nano metal solution is radiated by laser to be hardened, thereby conducting the repair sections with line. Furthermore, the gate lines and the capacitor lines are formed separately, so that the gate lines have lower load and the signal delay on the gate lines can be improved.

BRIEF DESCRIPTION OF THE DRAWINGS

The structure, operating principle and effects of the present disclosure will be described in detail by way of various embodiments which are illustrated in the accompanying drawings.

DETAILED DESCRIPTION OF THE PREFERRED EMBODIMENTS

Figure 1:
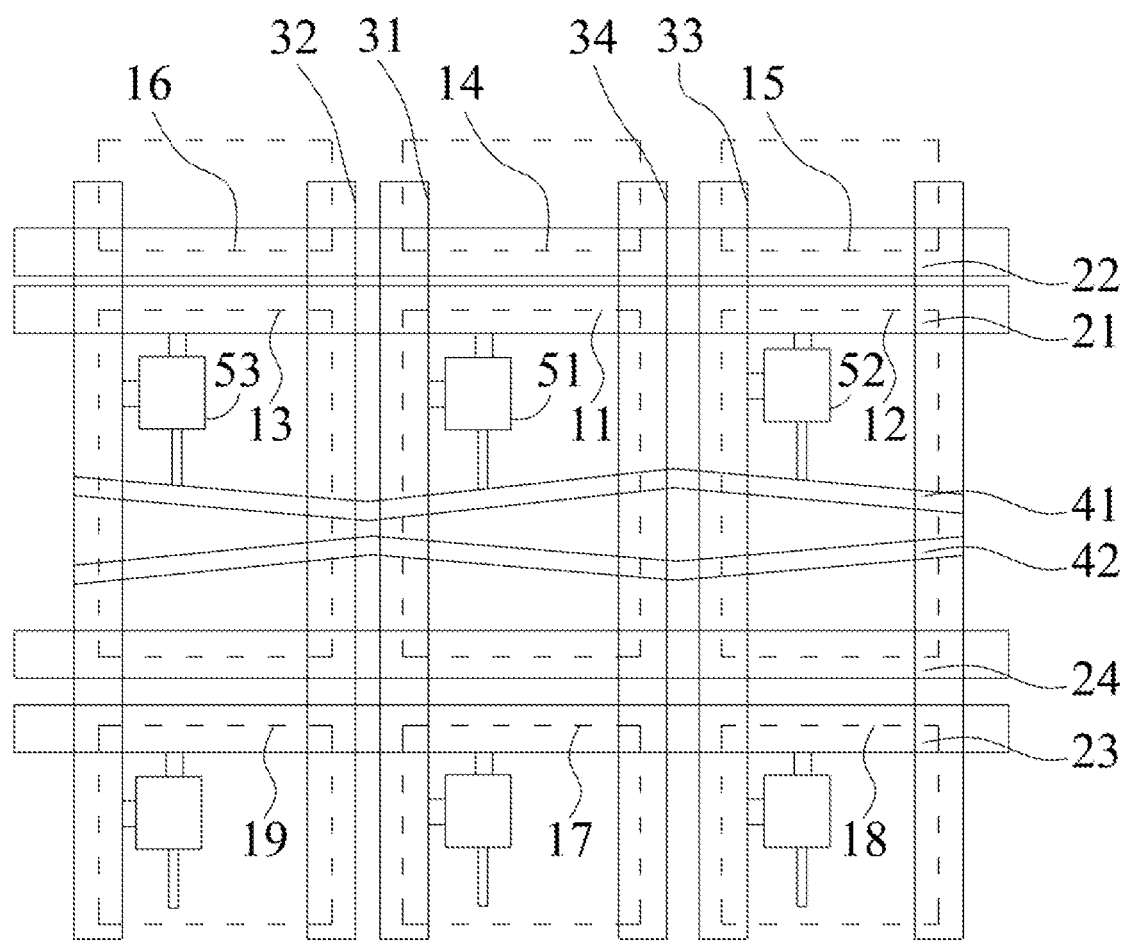
FIG. 1 is a plan view of an active matrix substrate of an embodiment of the present disclosure.

The following embodiments of the present disclosure are herein described in detail with reference to the accompanying drawings. These drawings show specific examples of the embodiments of the present disclosure. It is to be understood that these embodiments are exemplary implementations and are not to be construed as limiting the scope of the present disclosure in any way. Further modifications to the disclosed embodiments, as well as other embodiments, are also included within the scope of the appended claims. These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts.

It is to be understood that, although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" includes any and all combinations of one or more of the associated listed items.

Figure 9:
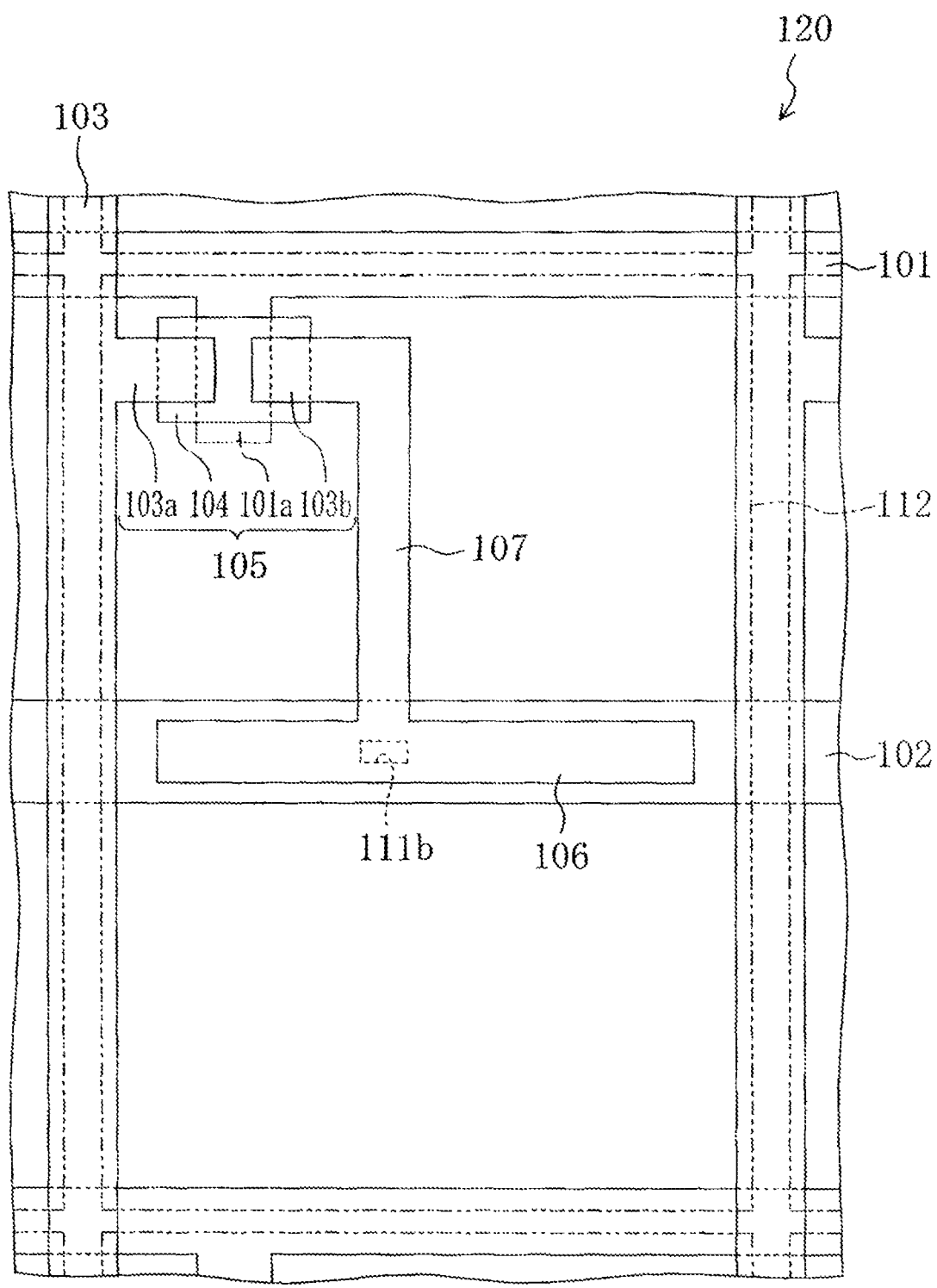
FIG. 9 is a plan view of a pixel of the active matrix substrate of an embodiment of the present disclosure.

FIG. 9 is a plan view of a pixel of an active matrix substrate 120 for exemplary illustration. The active matrix substrate 120 includes a plurality of pixel electrodes 112 disposed in a matrix form, a plurality of thin-film transistors (TFT) 105 disposed on the plurality of pixel electrodes 112 respectively, a plurality of gate lines 101 disposed between the plurality of pixel electrodes 112 respectively and extended in parallel to each other, a plurality of source lines 103 disposed between the pixel electrodes 112, extended in parallel to each other, and crossing the plurality of gate lines 101, and a plurality of capacitor lines 102 disposed between the plurality of gate lines 101 and extended in parallel to each other.

The thin-film transistor (TFT) 105 includes a gate electrode 101a electrically connected to the gate line 101, a semiconductor layer 104 covering the gate electrode 101a, a source electrode 103a connected to the source line 103 disposed over the semiconductor layer 104, and a drain electrode 103b disposed over the semiconductor layer 104 and opposite to the source electrode 103a. The drain electrode 103b is extended to the area where the capacitor line 102 is extended, and electrically connected to the pixel electrode 112 through a contact hole 111b, so as to form a drain lead-out electrode 107 and a capacitor electrode 106.

Furthermore, a liquid crystal display device includes the active matrix substrate 120 including above-mentioned elements, a counter substrate having common electrode, and a liquid crystal layer including liquid crystal molecules and disposed between the active matrix substrate 120 and the counter substrate. By controlling the switching functions of the TFTs 105 to transmit corresponding image signals to the pixel electrodes 112 connected to the TFT 105 respectively, the liquid crystal display device can display an image. In order to prevent the TFT 105 from self-discharging in the turn off period, or to prevent image signal degradation caused by the leakage current of the TFT 105, or to apply various harmonic signals for driving the liquid crystal, an auxiliary capacitor is formed between the capacitor line 102 and the capacitor electrode 106.

FIG. 1 is a plan view of an active matrix substrate of an embodiment of the present disclosure. As shown in FIG. 1. the active matrix substrate includes a substrate, a plurality of pixel electrodes 11, 12, 13, 14, 15, 16, 17, 18 and 19, a plurality of first gate lines 21 and 23, a plurality of first source lines 31 and 33, a plurality of first capacitor lines 41, a plurality of switch devices 51, 52 and 53, a plurality of second source lines 32 and 34, a plurality of second gate lines 22 and 24, and a plurality of second capacitor lines 42. The plurality of pixel electrodes 11, 12, 13, 14, 15, 16, 17, 18 and 19 are disposed on the substrate and arranged in a matrix form to form a plurality of pixels. The plurality of first gate lines 21 and 23 are respectively disposed between the pixel electrodes 11, 12, 13, 14, 15, 16, 17, 18 and 19, for example, the first gate line 21 is disposed between the pixel electrodes 11 and 14, between the pixel electrodes 12 and 15, and between the pixel electrodes 13 and 16. The plurality of first gate lines 21 and 23 are extended in parallel to each other and configured to output scan signals. The first source lines 31 and 33 are respectively disposed between the pixel electrodes 11, 12, 13, 14, 15, 16, 17, 18, and 19. For example, the first source line 31 is disposed between the pixel electrodes 11 and 13, between the pixel electrodes 14 and 16, and between the pixel electrodes 17 and 19. The first source lines 31 and 33 are extended in a direction crossing to the first gate lines 21 and 23, and configured to output data signals. The first capacitor lines 41 respectively disposed between the first gate lines 21 and 23, extended nonparallel to each other, and configured to output capacitor signals. The switch devices 51, 52 and 53 are respectively disposed over the pixel electrodes 11, 12 and 13, and electrically connected to the pixel electrodes 11, 12 and 13, the first gate lines 21, the capacitor lines 41 and the first source lines 31 and 33, respectively. The second source lines 32 and 34 respectively disposed between the pixel electrodes 11, 12, 13, 14, 15, 16, 17, 18, and 19, and extended in parallel to the first source lines 31 and 33. For example, the second source lines 32 is disposed between the pixel electrodes 11 and 13, between the pixel electrodes 14 and 16, and between the pixel electrodes 17 and 19, and extended in parallel to the first source lines 31. The second source line 32 is used to repair a broken line. The plurality of second gate lines 22 and 24 are respectively disposed between the pixel electrodes 11, 12, 13, 14, 15, 16, 17, 18, and 19, and extended in parallel to the first gate lines 21 and 23. For example, the second gate line 22 is disposed between the pixel electrodes 11 and 14, between the pixel electrodes 12 and 15, and between the pixel electrodes 13 and 16, and extended in parallel to the first gate lines 21. The second gate line 22 can be used to repair a broken line. The plurality of second capacitor lines 42 are respectively disposed adjacent to and extended in nonparallel to the first capacitor lines 41. The first gate lines 21 and 23, the first capacitor lines 41, the first source lines 31 and 33, the second gate lines 22 and 24, the second capacitor lines 42, and the second source lines 32 and 34 are isolated from each other.

Figure 2:
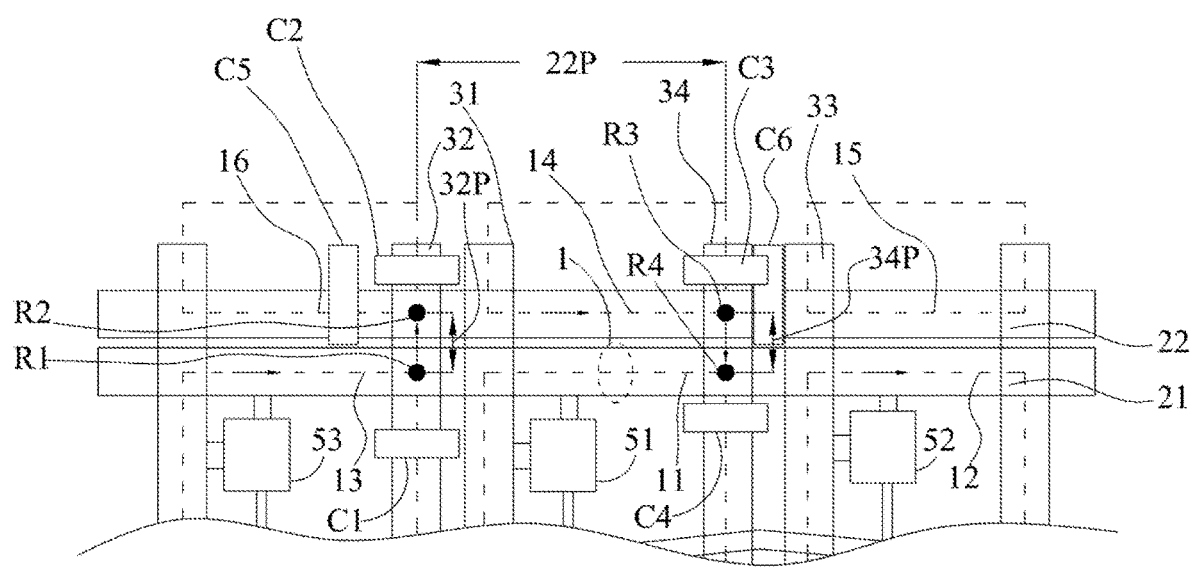
FIG. 2 is a plan view of an active matrix substrate of an embodiment of the present disclosure, after the broken first gate line is repaired.
Figure 8:
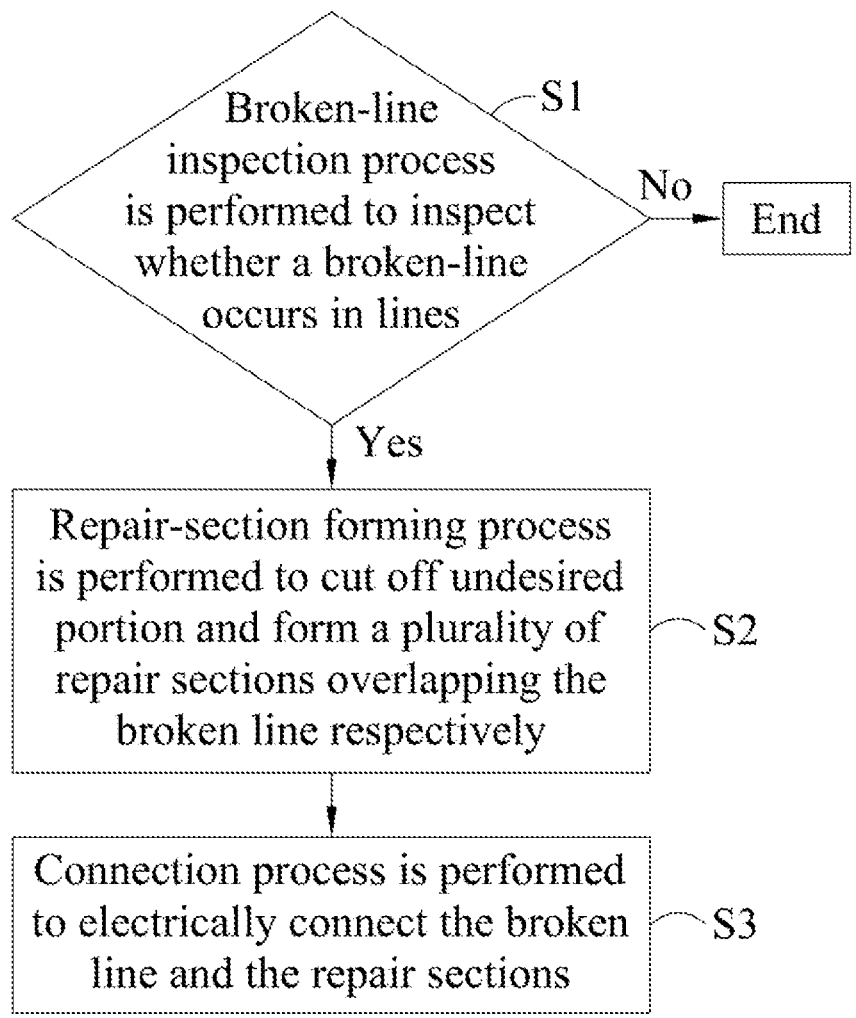
FIG. 8 is a flowchart showing the steps in an operation of a repair method for an active matrix substrate of an embodiment of the present disclosure.

FIG. 8 is a flowchart showing the steps in an operation of a repair method applied to an active matrix substrate of an embodiment of the present disclosure. As shown in FIG. 8, the repair method includes following steps. In step S1, a broken-line inspection process is performed to inspect whether a broken-line occurs in above-mentioned gate line, source line or capacitor line. If there is no broken-line, the repair method is terminated. If a broken-line is inspected, a step S2 is performed. In step S2, a repair-section forming process is performed to cut off an undesired portion and form a plurality of repair sections overlapping the broken line respectively. Next, in step S3, a connection process is performed to electrically connect the broken line and the repair sections. In the embodiment, the aforementioned steps are performed to repair the broken line in the active matrix substrate. FIG. 2 is a plan view of an active matrix substrate of an embodiment of the present disclosure, after the broken first gate line is repaired. Please refer to FIG. 2. If it inspects that the first gate line 21 is broken at the broken location 1, the following steps of the repair method of the active matrix substrate are executed. First, the broken-line inspection process is performed to inspect, by a known visual, electric or optical inspection manner, whether the first gate line 21 or the second gate line 22 is broken. If only the first gate line 21 is inspected to be broken, a source line repair-section forming process is performed to cut off, such as by laser radiation manner, the cut portions C1, C2, C3 and C4 of the second source lines 32 and 34 disposed at two sides of the pixel electrode 11 corresponding to the broken location 1 of the first gate line 21, so as to form source line repair sections 32P and 34P respectively including overlapping portions R1, R2, R3 and R4 where the broken first gate line 21 and the second gate line 22 are overlapped by the source line repair sections 32P and 34P. The cut portions C1 and C4 locate near the same side of the broken first gate line 21 opposite to the second gate line 22, and the cut portions C2 and C3 locate near the same side of the second gate line 22 opposite to the broken first gate line 21. Next, a gate line repair-section forming process is performed on the second gate line 22 adjacent to the broken first gate line 21, to cut off the cut portions C5 and C6 respectively located at two sides of the broken location 1 and the two sides of the second source lines 32 and 34 disposed at two sides of the broken location 1, so as to form the gate line repair section 22P including overlapping portions R2 and R3 where the second source lines 32 and 34 are overlapped with the gate line repair section 22P. Next, the connection process is performed to electrically connect the source line repair sections 32P and 34P to the first gate line 21 at the overlapping portions R1 and R4, respectively, and connect the source line repair sections 32P and 34P to the gate line repair section 22P at the overlapping portions R2 and R3. The connection process of the present disclosure can be implemented by laser irradiation welding manner; furthermore, the connection portions (such as the overlapping portions R1, R4, R2, and R3) of the repair sections can be coated with nano metal solution, and radiated by the laser to harden the nano metal solution, thereby conduct the repair sections.

After the repair method is performed, the scan signal (shown by an arrowhead in FIG. 2) can be smoothly transmitted to downstream circuits along the first gate line 21 through the repair path formed by the source line repair section 32P, the gate line repair section 22P and the source line repair section 34P. As a result, the manufacturing yield of the liquid crystal display device can be improved.

Figure 3:
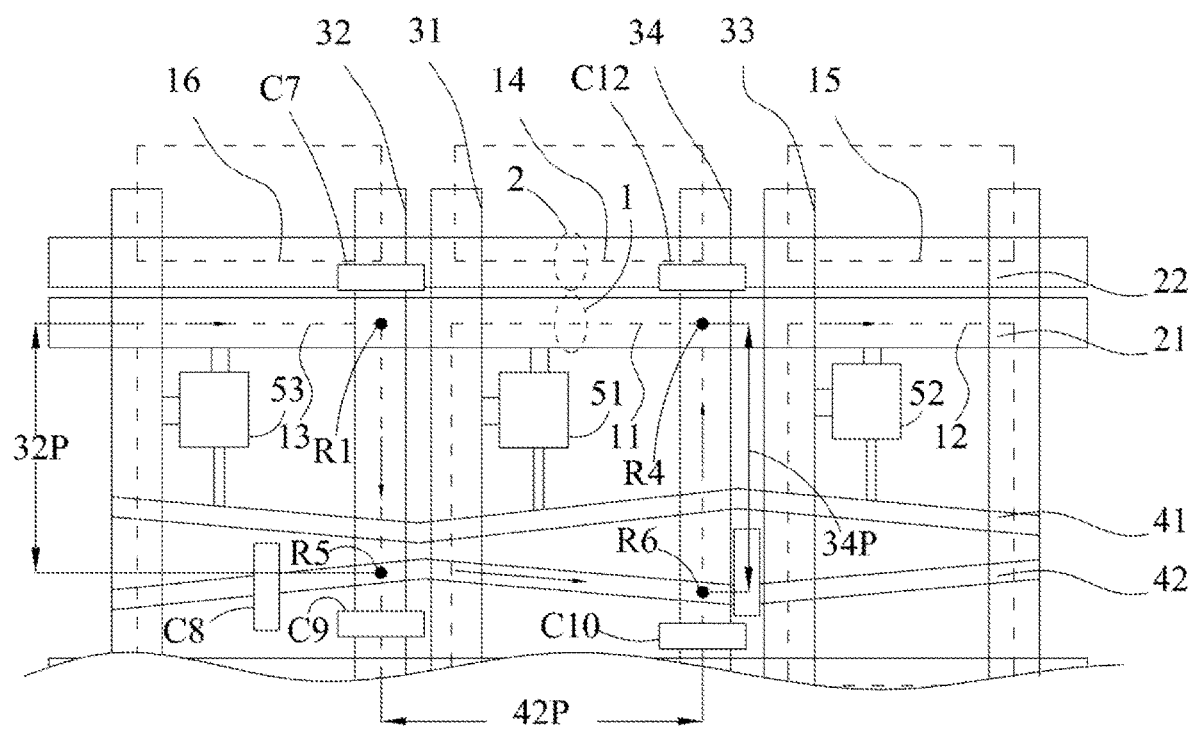
FIG. 3 is a plan view of an active matrix substrate of an embodiment of the present disclosure, after the broken first gate line and the broken second gate line both are repaired.

FIG. 3 is a plan view of an active matrix substrate of an embodiment of the present disclosure, after the broken first gate line and the broken second gate line are repaired. Please refer to FIG. 3. If it inspects that the first gate line 21 and the second gate line 22 are broken at the broken locations 1 and 2, respectively, the following steps of the repair method of the active matrix substrate are executed. First, the broken-line inspection process is performed to inspect, by the known visual, electric or optical inspection manner, whether the first gate line 21 or the second gate line 22 is broken. If the first gate line 21 and the second gate line 22 both are inspected to be broken, and the broken locations 1 and 2 both locate between the pixel electrode 11 and the pixel electrode 14, a source line repair-section forming process is performed to cut off the cut portions C7, C9, C10 and C12 of the second source lines 32 and 34 disposed at two sides of the pixel electrode 11 corresponding to the broken locations 1 and 2 of the first gate line 21 and the second gate line 22, so as to form source line repair sections 32P and 34P respectively including overlapping portions R1, R4, R5 and R6 where the broken first gate line 21 and the second capacitor line 42 are overlapped with the source line repair sections 32P and 34P. The cut portions C7 and C12 locate near the same side of the broken first gate line 21 opposite to the broken second capacitor line 42, and the cut portions C9 and C10 locate near the same side of the second capacitor line 42 opposite to the broken first gate line 21. Next, a gate line repair-section forming process is performed on the second capacitor line 42 to cut off, such as by laser radiation manner, the cut portions C8 and C11 of the second capacitor line 42 respectively located at two sides of the broken location 1 and the outer sides of the second source lines 32 and 34 disposed at two sides of the broken location 1, so as to form the capacitor line repair section 42P including overlapping portions R5 and R6 where the second source lines 32 and 34 are overlapped with the capacitor line repair section 42P. Next, the connection process is performed to electrically connect the source line repair sections 32P and 34P to the first gate line 21 at the overlapping portions R1 and R4, respectively, and connect the source line repair sections 32P and 34P to the capacitor line repair section 42P at the overlapping portions R5 and R6. The connection process of the present disclosure can be implemented by laser irradiation welding manner; furthermore, nano metal solution can be coated on the connection portions (such as the overlapping portions R1, R5, R4, and R6) of the repair sections, and the laser is used to radiate on the connection portions to harden the nano metal solution, thereby conduct the repair sections.

After the repair method is performed, the scan signal (shown by an arrowhead in FIG. 3) can be smoothly transmitted to downstream circuits along the first gate line 21 through the repair path formed by the source line repair section 32P, the capacitor line repair section 42P and the source line repair section 34P. As a result, the manufacturing yield of the liquid crystal display device can be improved.

Figure 4:
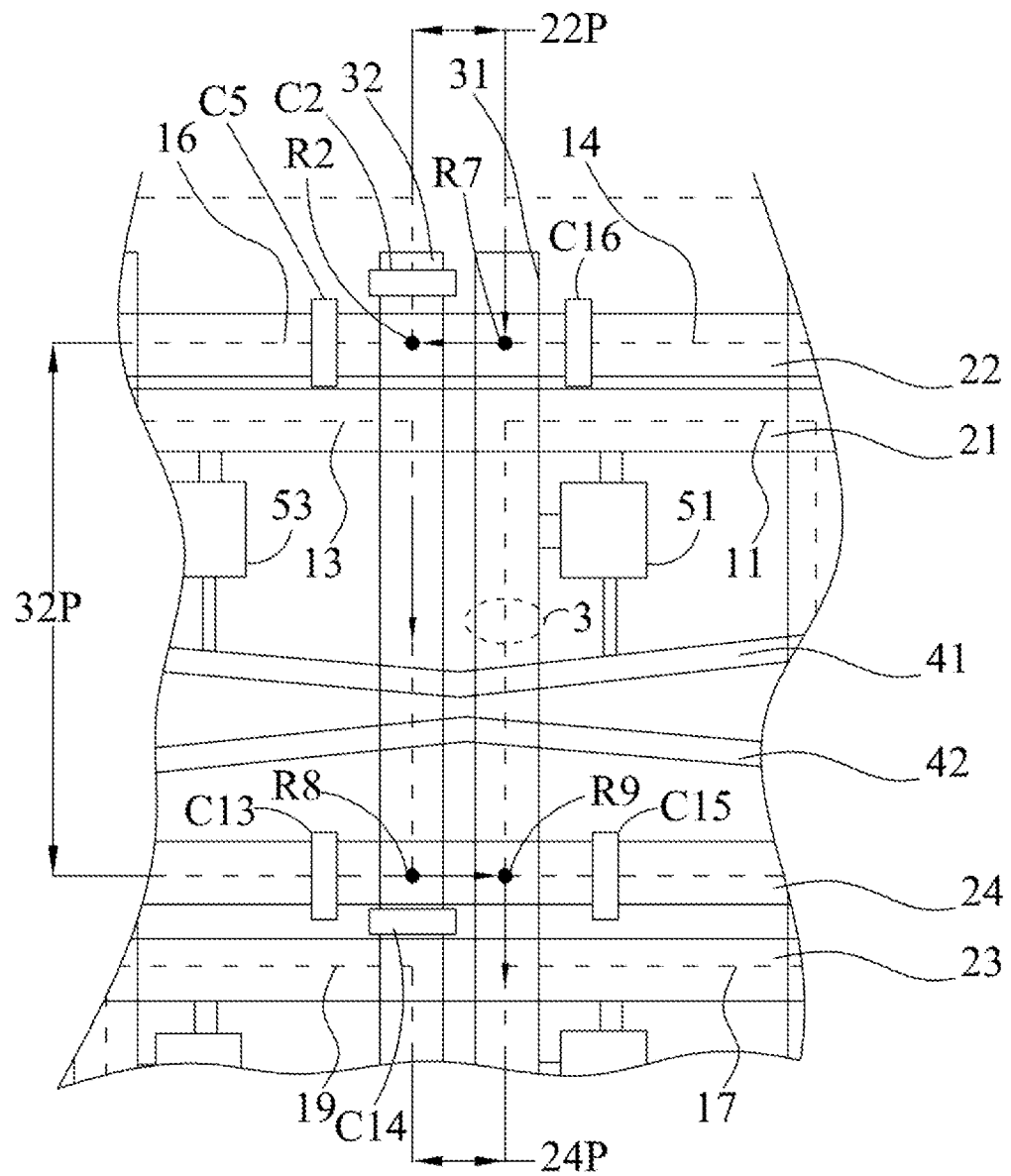
FIG. 4 is a plan view of an active matrix substrate of an embodiment of the present disclosure, after the broken first source line is repaired.

FIG. 4 is a plan view of an active matrix substrate of an embodiment of the present disclosure, after the broken first source line is repaired. Please refer to FIG. 4. If it inspects that the first source line 31 is broken at the broken location 3, the following steps of the repair method of the active matrix substrate are executed. First, the broken-line inspection process is performed to inspect whether the first source line 31 or the second source line 32 is broken. If only the first source line 31 is inspected to be broken, a gate line repair-section forming process is performed to cut off the cut portions C5, C15, C13 and C16 of the second gate lines 22 and 24 disposed at two sides of the pixel electrode 11 corresponding to the broken location 3 of the first source line 31, so as to form gate line repair sections 22P and 24P respectively including overlapping portions R2, R7, R8 and R9 where the broken first source line 31 and the second source line 32 are overlapped with the gate line repair sections 22P and 24P respectively. The cut portions C15 and C16 locate near the same side of the broken first source line 31 opposite to the second source line 32, and the cut portions C5 and C13 locate near the same side of the second source line 32 opposite to the broken first source line 31. Next, a source line repair-section forming process is performed on the second source line 32, adjacent to the broken first source line 31, to cut off the cut portions C2 and C14 respectively located at the outer sides of the second gate lines 22 and 24 disposed at two sides of the pixel electrode 11, so as to form the source line repair section 32P including overlapping portions R2 and R8 where the second gate lines 22 and 24 are overlapped with the source line repair section 32P respectively. Next, the connection process is performed to electrically connect the gate line repair sections 22P and 24P to the broken first source line 31 at the overlapping portions R7 and R9, respectively, and connect the source line repair sections 32P to the gate line repair section 22P and 24P at the overlapping portions R2 and R8. The connection process of the present disclosure can be implemented by laser irradiation welding manner; furthermore, nano metal solution can be coated on the connection portions (such as the overlapping portions R2, R7, R8, and R9) of the repair sections, and the laser is used to radiate on the connection portions to harden the nano metal solution, thereby conduct the repair sections.

After the repair method is performed, the data signal (shown by an arrowhead in FIG. 4) can be smoothly transmitted to downstream circuits along the first source line 31 through the repair path formed by the gate line repair section 22P, the source line repair section 32P and the gate line repair section 24P. As a result, the manufacturing yield of the liquid crystal display device can be improved.

Figure 5:
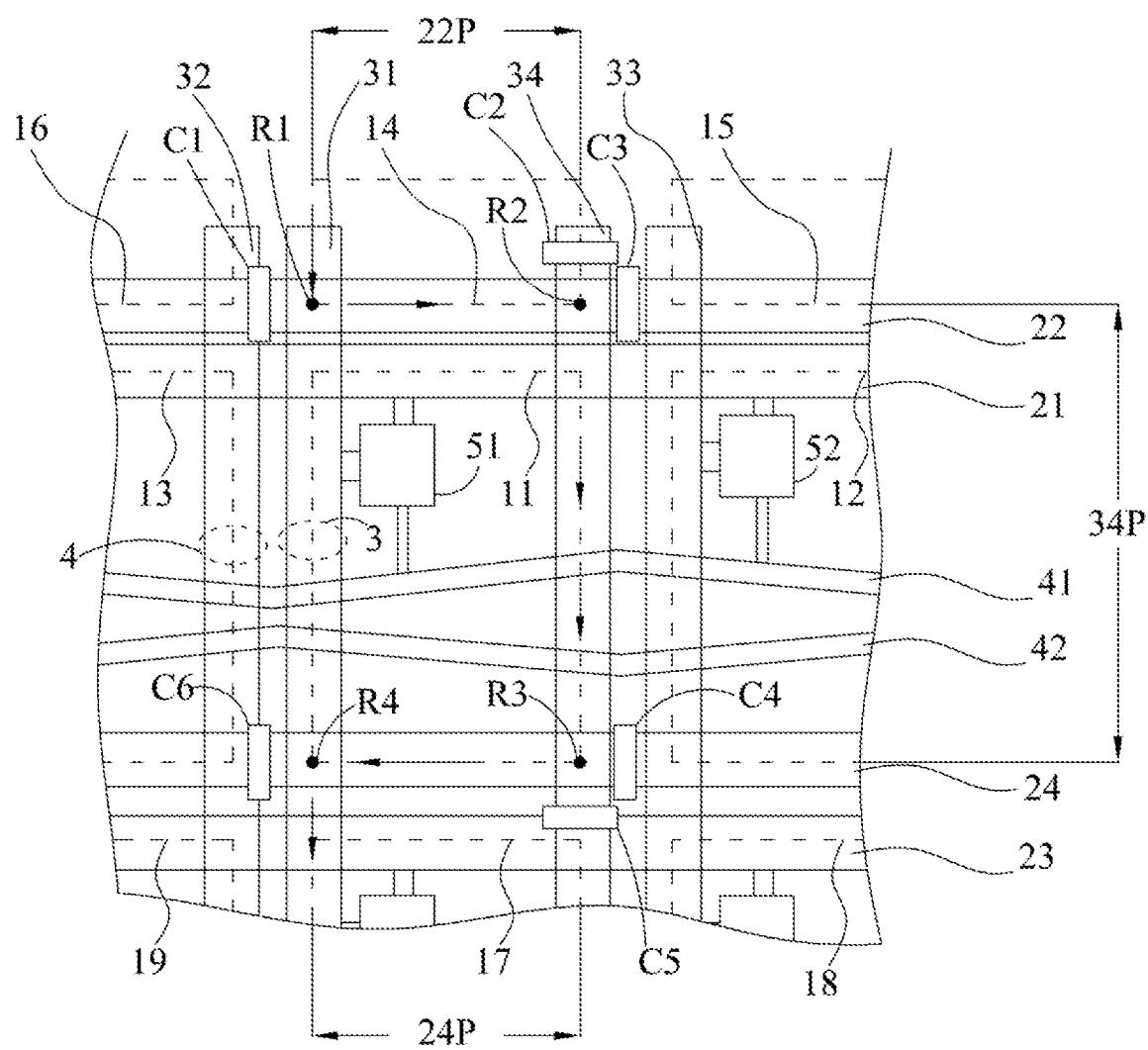
FIG. 5 is a plan view of an active matrix substrate of an embodiment of the present disclosure, after the broken first source line and the broken second source line both are repaired.

FIG. 5 is a plan view of an active matrix substrate of an embodiment of the present disclosure, after the broken first source line and the broken second source line are repaired. Please refer to FIG. 3. If it inspects that the first source line 31 and the second source line 32 are broken at the broken locations 3 and 4, respectively, the following steps of the repair method of the active matrix substrate are executed. First, the broken-line inspection process is performed to inspect whether the first source line 31 or the second source line 32 is broken. If the first source line 31 and the second source line 32 both are inspected to be broken, and the broken locations 3 and 4 both located between the pixel electrode 11 and the pixel electrode 13, a gate line repair-section forming process is performed to cut off the cut portions C1, C6, C3 and C4 of the second gate lines 22 and 24 disposed at two sides of the pixel electrode 11 corresponding to the broken locations 3 and 4, so as to form gate line repair sections 22P and 24P respectively including overlapping portions R1, R2, R3 and R4 where the broken first source line 31 and the other second source line 34 are overlapped with the gate line repair sections 22P and 24P. The cut portions C1 and C6 locate near the same side of the broken first source line 31 opposite to the other second source line 34, and the cut portions C3 and C4 locate near the same side of the other second source line 34 opposite to the broken first source line 31. The other second source line 34 can be a second source line which is the second nearest to the first source line 31. Next, a source line repair-section forming process is performed on the other second source line 34 to cut off the cut portions C2 and C5 respectively located at the outer sides of the second gate lines 22 and 24 disposed at two sides of the pixel electrode 11, so as to form the source line repair section 34P including overlapping portions R2 and R3 where the second gate lines 22 and 24 are overlapped with the source line repair section 34P. Next, the connection process is performed to electrically connect the gate line repair sections 22P and 24P to the first source line 31 at the overlapping portions R1 and R4, respectively, and connect the gate line repair sections 22P and 24P to the other second source line 34 at the overlapping portions R2 and R3. The connection process of the present disclosure can be implemented by laser irradiation welding manner; furthermore, nano metal solution can be coated on the connection portions (such as the overlapping portions R1, R2, R3, and R4) of the repair sections, and the laser is used to radiate on the connection portions to harden the nano metal solution, thereby conduct the repair sections.

After the repair method is performed, the data signal (shown by an arrowhead in FIG. 5) can be smoothly transmitted to downstream circuits along the first source line 31 through the repair path formed by the gate line repair section 22P, the source line repair section 34P and the gate line repair section 24P. As a result, the manufacturing yield of the liquid crystal display device can be improved.

Figure 6:
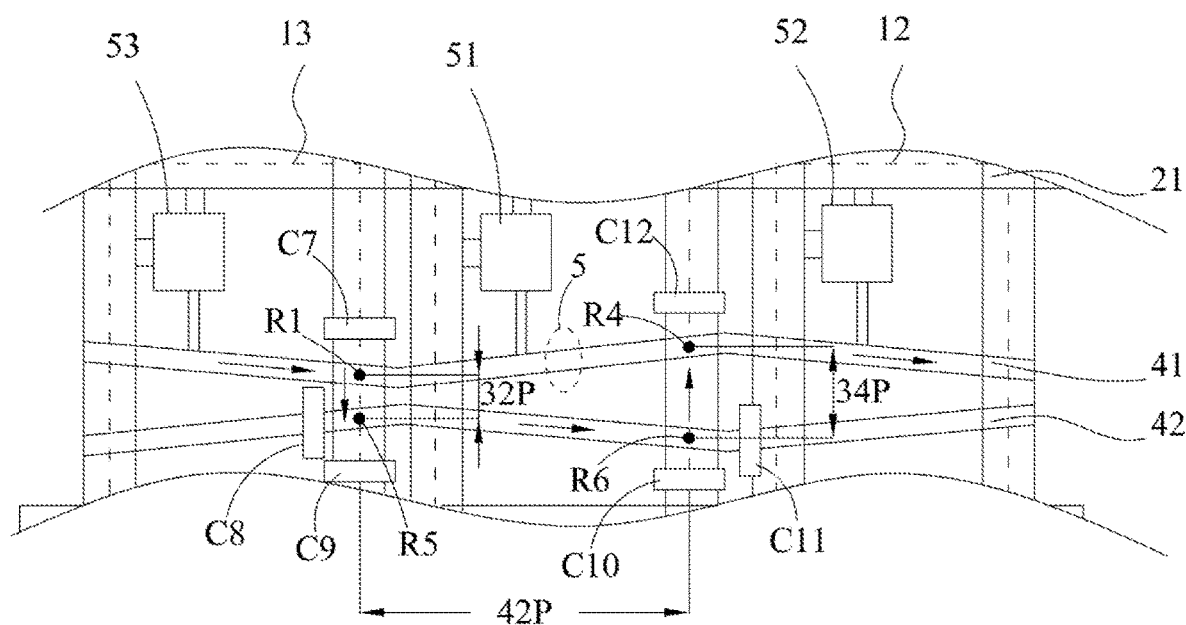
FIG. 6 is a plan view of an active matrix substrate of an embodiment of the present disclosure, after the broken first capacitor line is repaired.

FIG. 6 is a plan view of an active matrix substrate of an embodiment of the present disclosure, after the broken first capacitor line is repaired. Please refer to FIG. 6. If it inspects that the first capacitor line 41 is broken at the broken location 5, the following steps of the repair method of the active matrix substrate are executed. First, the broken-line inspection process is performed to inspect whether the first capacitor line 41 or the second capacitor line 42 is broken. If only the first capacitor line 41 is inspected to be broken, a source line repair-section forming process is performed to cut off the cut portions C7, C12, C9 and C10 of the second source lines 32 and 34 disposed at two sides of the pixel electrode 11 corresponding to the broken location 5 of the first capacitor line 41, so as to form source line repair sections 32P and 34P respectively including overlapping portions R1, R5, R4 and R6 where the broken first capacitor line 41 and the second capacitor line 42 are overlapped with the source line repair sections 32P and 34P. The cut portions C7 and C12 locate near the same side of the broken first capacitor line 41 opposite to the second capacitor line 42, and the cut portions C9 and C10 locate near the same side of the second capacitor line 42 opposite to the broken first capacitor line 41. Next, a capacitor line repair-section forming process is performed on the second capacitor line 42, adjacent to the broken first capacitor line 41, to cut off the cut portions C8 and C11 respectively located at the outer sides of the second source lines 32 and 34 disposed at two sides of the pixel electrode 11, so as to form capacitor line repair section 42P including overlapping portions R5 and R6 where the second source lines 32 and 34 are overlapped with the capacitor line repair section 42P. Next, the connection process is performed to electrically connect the source line repair sections 32P and 34P to the first capacitor line 41 at the overlapping portions R1 and R4, respectively, and connect the capacitor line repair sections 42P to the source line repair sections 32P and 34P at the overlapping portions R5 and R6. The connection process of the present disclosure can be implemented by laser irradiation welding manner; furthermore, nano metal solution can be coated on the connection portions (such as the overlapping portions R1, R5, R4, and R6) of the repair sections, and the laser is used to radiate on the connection portions to harden the nano metal solution, thereby conduct the repair sections.

After the repair method is performed, the capacitor signal (shown by an arrowhead in FIG. 6) can be smoothly transmitted to downstream circuits along the first capacitor line 41 through the repair path formed by the source line repair section 32P, the capacitor line repair section 42P and the source line repair section 34P. As a result, the manufacturing yield of the liquid crystal display device can be improved.

Figure 7:
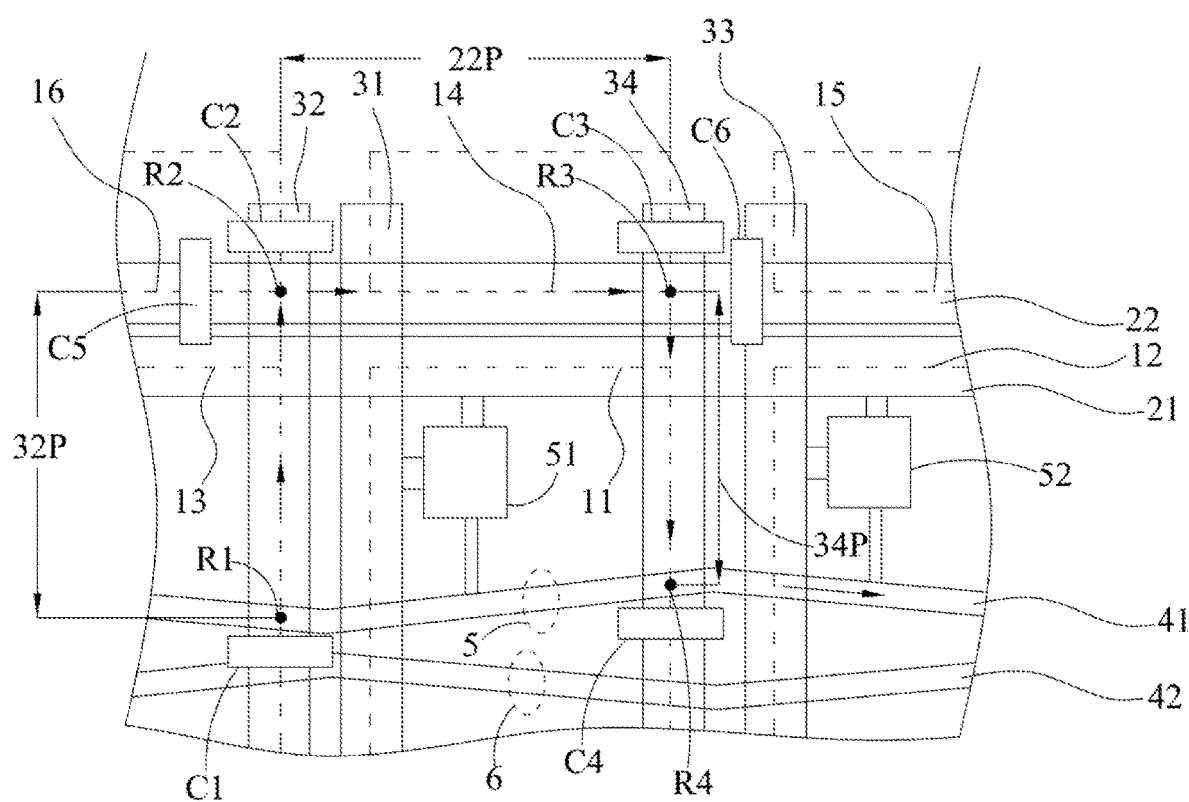
FIG. 7 is a plan view of an active matrix substrate of an embodiment of the present disclosure, after the broken first capacitor line and the broken second capacitor line are repaired.

FIG. 7 is a plan view of an active matrix substrate of an embodiment of the present disclosure, after the broken first capacitor line and the broken second capacitor line are repaired. Please refer to FIG. 7. If it inspects that the first capacitor line 41 and the second capacitor line 42 both are broken, for example, at the broken locations 5 and 6, the following steps of the repair method of the active matrix substrate are executed. First, the broken-line inspection process is performed to inspect whether the first capacitor line 41 or the second capacitor line 42 is broken. If the first capacitor line 41 and the second capacitor line 42 both are inspected to be broken, and the broken locations 5 and 6 both are located in the pixel electrode 11, a source line repair-section forming process is performed to cut off the cut portions C1, C4, C2 and C3 of the second source lines 32 and 34 disposed at two sides of the pixel electrode 11 corresponding to the broken locations 5 and 6, so as to form source line repair sections 32P and 34P respectively including overlapping portions R1, R2, R3 and R4 where the broken first capacitor line 41 and the second gate line 22 are overlapped with the source line repair sections 32P and 34P. The cut portions C1 and C4 locate near the same side of the broken first capacitor line 41 opposite to the second gate line 22, and the cut portions C2 and C3 locate near the same side of the second gate line 22 opposite to the broken first capacitor line 41. Next, a gate line repair-section forming process is performed on the second gate line 22 to cut off the cut portions C5 and C6 respectively located at the two sides of the second source lines 32 and 34 disposed at two sides of the pixel electrode 11, so as to form the gate line repair section 22P including overlapping portions R2 and R3 where the second source lines 32 and 34 are overlapped with gate line repair section 22P. Next, the connection process is performed to electrically connect the source line repair sections 32P and 34P to the first capacitor line 41 at the overlapping portions R1 and R4, respectively, and connect the gate line repair section 22P to the source line repair sections 32P and 34P at the overlapping portions R2 and R3. The connection process of the present disclosure can be implemented by laser irradiation welding manner; furthermore, nano metal solution can be coated on the connection portions (such as the overlapping portions R1, R2, R3, and R4) of the repair sections, and the laser is used to radiate on the connection portions to harden the nano metal solution, thereby conduct the repair sections.

As a result, after the repair method is performed, the capacitor signal (shown by an arrowhead in FIG. 7) can be smoothly transmitted to downstream circuits along the first capacitor line 41 through the repair path formed by the source line repair section 32P, the gate line repair section 22P and the source line repair section 34P. As a result, the manufacturing yield of the liquid crystal display device can be improved.

In an embodiment, an area of each of the overlapping portions R1, R2, R3, R4, R5, R6, R7, R8 and R9 is at least 25 $\mu m^2$.

In an embodiment, the active matrix substrate of the present disclosure can be applicable to, but not limited to, liquid crystal display device, display device, Q LED display device, curved display device, or other display device.

According to an embodiment, the repair method of the active matrix substrate is applicable to method of manufacturing liquid crystal display device. According to aforementioned embodiment, the present disclosure provides the active matrix substrate with broken-line repair function, to improve the manufacturing yield of the liquid crystal display device. Furthermore, the nano metal solution is coated at the connection portions of the repair sections and is radiated by laser to be hardened, thereby conducting the repair sections. Preferably, the nano metal solution includes organic solvent and metal nano particles uniformly distributed in the organic solvent. Furthermore, the gate lines and the capacitor lines are formed separately, so that the gate line has lower load and the signal delay on the gate line can be improved.

The present disclosure disclosed herein has been described by means of specific embodiments. However, numerous modifications, variations and enhancements can be made thereto by those skilled in the art without departing from the spirit and scope of the disclosure set forth in the claims.

What is claimed is:

1. An active matrix substrate, comprising:
   a substrate;
   a plurality of pixel electrodes disposed on the substrate and arranged in a matrix form, so as to form a plurality of pixels;
   a plurality of first gate lines disposed between the plurality of pixel electrodes respectively, and extended in parallel to each other;
   a plurality of first source lines disposed between the plurality of pixel electrodes respectively, and extended in a direction crossing the plurality of first gate lines;
   a plurality of first capacitor lines disposed between the plurality of first gate lines respectively, and extended at an angle to one another;
   a plurality of switch devices disposed on the plurality of pixel electrodes respectively, and electrically connected to the plurality of pixel electrodes, the plurality of first gate lines, the plurality of first capacitor lines and the plurality of first source lines, respectively;
   a plurality of second source lines disposed between the plurality of pixel electrodes respectively, and extended in parallel to the plurality of first source lines;
   a plurality of second gate lines disposed between the plurality of pixel electrodes respectively, and extended in parallel to the plurality of first gate lines; and
   a plurality of second capacitor lines disposed adjacent to the plurality of first capacitor lines respectively, and extended at an angle to one another;
   wherein the plurality of first gate lines, the plurality of first capacitor lines, the plurality of first source lines, the plurality of second gate lines, the plurality of second capacitor lines and the plurality of second source lines are isolated from each other;
   wherein when one of the first gate lines is broken and one of the second gate lines adjacent to the broken first gate line is also broken and broken locations are between two of the pixel electrodes, an end and another end of the broken first gate line are conducted through a pair of source line repair sections formed by parts of the second source lines, and a capacitor line repair section formed by parts of the second capacitor lines.

2. The active matrix substrate according to claim 1, wherein when only one of the plurality of the first gate lines is broken, the end and the another end of the broken first gate line are conducted through the second gate line adjacent to the broken first gate line, and a pair of source line repair sections formed by parts of the second source lines at two sides of the broken first gate line.

3. The active matrix substrate according to claim 1, wherein when only one of the first source lines is broken, the end and the another end of the broken first source line are conducted through the second source line adjacent to the first source line, and a pair of gate line repair sections formed by parts of the second gate lines at two sides of the broken first source line.

4. The active matrix substrate according to claim 1, wherein when one of the first source lines is broken, and one of the second source lines adjacent to the broken first source line is also broken and broken locations are between two of the pixel electrodes, the end and the another end of the broken first source line is conducted through a pair of gate line repair sections formed by a part of the second gate lines and a source line repair section formed by a part of the another one of the second source lines.

5. The active matrix substrate according to claim 1, wherein when only one of the first capacitor lines is broken, the end and the another end of the broken first capacitor line are conducted through a pair of source line repair sections formed by parts of the second source lines corresponding in position to two sides of the broken first capacitor line, and the second capacitor line adjacent to the broken first capacitor line.

6. The active matrix substrate according to claim 1, wherein when one of the first capacitor lines is broken, and one of the second capacitor lines adjacent to the broken first capacitor line is also broken and broken locations are between two of the pixel electrodes, the end and the another ends of the first capacitor line are conducted through a pair of source line repair sections formed by parts of the second source lines, and a gate line repair section formed by a part/of the second gate lines.

7. The active matrix substrate according to claim 1, wherein an area of an overlapping portion between the second source line and the second capacitor line is at least 25 μm².

8. A display device, comprising the active matrix substrate according to claim 1.

9. The display device according to claim 8, wherein when only one of the plurality of the first gate lines is broken, the end and the another end of the broken first gate line are conducted through the second gate line adjacent to the broken first gate line, and a pair of source line repair sections formed by parts of two second source lines at two sides of the broken first gate line.

10. The display device according to claim 8, wherein when only one of the first source lines is broken, the end and the another end of the broken first source line are conducted through the second source line adjacent to the broken first source line, and a pair of gate line repair sections formed by parts of the second gate lines at two sides of the broken first source line.

11. The display device according to claim 8, wherein when one of the first source lines is broken, and one of the second source lines adjacent to the broken first source line is also broken and broken locations are between two of the pixel electrodes, the end and the another end of the broken first source line are conducted through a pair of gate line repair sections formed by parts of the second gate lines, and a source line repair section formed by a part of the another one of the second source lines.

12. The display device according to claim 8, wherein when only one of the first capacitor lines is broken, the end and the another end of the broken first capacitor line are conducted through a pair of source line repair sections formed by parts of the second source lines corresponding in position to two sides of the broken first capacitor line, and the second capacitor line adjacent to the broken first capacitor line.

13. The display device according to claim 8, wherein when one of the first capacitor lines is broken, and one of the second capacitor lines adjacent to the broken first capacitor line is also broken and broken locations are between two of the pixel electrodes, the end and the another ends of the broken first capacitor line are conducted through a pair of source line repair sections formed by parts of the second source lines, and a gate line repair section formed by a part of the second gate lines.

14. The display device according to claim 13, wherein operations of breaking and connection are performed by laser radiation.

15. The display device according to claim 14, wherein connection portions-of the source line repair section or the gate line repair section are coated with nano metal solution, and the nano metal solution comprises organic solvent and metal nano particles uniformly distributed in the organic solvent; and wherein the connection portions are radiated by laser to harden the nano metal solution for conduction.

16. The display device according to claim 8, wherein an area of an overlapping portion between the second source line and the second capacitor line is at least 25 μm².

17. An active matrix substrate, comprising:
a substrate;
a plurality of pixel electrodes disposed on the substrate and arranged in a matrix form to form a plurality of pixels;
a plurality of first gate lines disposed between the plurality of pixel electrodes respectively, and extended in parallel to each other;
a plurality of first source lines disposed between the plurality of pixel electrodes respectively, and extended in a direction crossing the plurality of first gate lines;
a plurality of first capacitor lines disposed between the plurality of first gate lines respectively, and extended at an angle to one another;
a plurality of switch devices disposed on the plurality of pixel electrodes respectively, and electrically connected to the plurality of pixel electrodes, the plurality of first gate lines, the plurality of first capacitor lines and the plurality of first source lines, respectively;
a plurality of second source lines disposed between the plurality of pixel electrodes respectively, and extended in parallel to the plurality of first source lines;
a plurality of second gate line disposed between the plurality of pixel electrodes respectively, and extended in parallel to the plurality of first gate lines; and
a plurality of second capacitor lines disposed adjacent to the plurality of first capacitor lines respectively, and extended at an angle to one another;
wherein the plurality of first gate lines, the plurality of first capacitor lines, the plurality of first source lines, the plurality of second gate lines, the plurality of second capacitor lines and the plurality of second source lines are isolated from each other;
wherein when one of the first gate lines is broken and one of the second gate lines adjacent to the broken first gate line is also broken, and broken locations are between two of the pixel electrodes, an end and another end of the broken first gate line are conducted through a pair of source line repair sections formed by parts of the second source lines, and a capacitor line repair section formed by parts of the second capacitor lines, and connection portions of the capacitor line repair section or the source line repair section are coated with nano metal solution.

18. The active matrix substrate according to claim 17, wherein the nano metal solution comprises organic solvent and metal nano particles uniformly distributed in the organic solvent; the connection portions are radiated by laser to harden the nano metal solution for conduction.

* * * * *